United States Patent
Song et al.

(10) Patent No.: US 8,364,477 B2
(45) Date of Patent: Jan. 29, 2013

(54) METHOD AND APPARATUS FOR INCREASING SPEECH INTELLIGIBILITY IN NOISY ENVIRONMENTS

(75) Inventors: Jianming J Song, Barrington, IL (US); John C Johnson, Spring Grove, IL (US)

(73) Assignee: Motorola Mobility LLC, Libertyville, IL (US)

( * ) Notice: Subject to any disclaimer, the term of this patent is extended or adjusted under 35 U.S.C. 154(b) by 0 days.

(21) Appl. No.: 13/599,587

(22) Filed: Aug. 30, 2012

(65) Prior Publication Data
US 2012/0323571 A1 Dec. 20, 2012

Related U.S. Application Data

(63) Continuation of application No. 11/137,182, filed on May 25, 2005, now Pat. No. 8,280,730.

(51) Int. Cl.
*G10L 19/14* (2006.01)
(52) U.S. Cl. ...... 704/225; 704/201; 704/203; 704/200.1; 704/207; 704/208; 704/209; 704/224; 704/226; 704/231; 704/248; 704/251; 704/254; 379/406.01; 379/406.08; 381/106; 381/94.2
(58) Field of Classification Search .................. 704/226, 704/231, 200.1, 201, 203, 207, 208, 209, 704/224, 248, 251, 254; 381/106, 94.2; 379/29.03, 379/406.01, 406.08
See application file for complete search history.

(56) References Cited

U.S. PATENT DOCUMENTS

| | | | |
|---|---|---|---|
| 4,401,851 A * | 8/1983 | Nitta et al. | 704/248 |
| 4,424,415 A * | 1/1984 | Lin | 704/209 |
| 4,611,101 A * | 9/1986 | Walter et al. | 379/29.03 |
| 4,783,802 A | 11/1988 | Takebayashi et al. | |
| 4,813,076 A * | 3/1989 | Miller | 704/254 |
| 4,827,516 A * | 5/1989 | Tsukahara et al. | 704/224 |
| 4,941,178 A | 7/1990 | Chuang | |
| 5,040,217 A | 8/1991 | Brandenburg et al. | |
| 5,175,769 A | 12/1992 | Hejna, Jr. et al. | |
| 5,285,502 A * | 2/1994 | Walton et al. | 381/94.2 |
| 5,307,405 A * | 4/1994 | Sih | 379/406.08 |
| 5,313,555 A | 5/1994 | Kamiya | |
| 5,341,457 A | 8/1994 | Hall, II et al. | |
| 5,459,813 A | 10/1995 | Klayman | |
| 5,463,695 A * | 10/1995 | Werrbach | 381/106 |

(Continued)

FOREIGN PATENT DOCUMENTS

GB 2327835 A 2/1999

OTHER PUBLICATIONS

Alango Technologies, "Noise Dependent Equalization (Audio Cruise Control)", http://www.alango.com/sound/tec_nde.html, 4 pages.

(Continued)

*Primary Examiner* — Michael Colucci
(74) *Attorney, Agent, or Firm* — Sylvia Chen; Philip A. Premysler

(57) ABSTRACT

A method (400, 500) and apparatus (220) seeks to improve the intelligibility of speech emitted into a noisy environment. Formants are identified (426) and perceptual frequency scale band is selected (502) that includes at least one of the identified formants. The SNR in each band is compared (504) to a threshold and, if the SNR for that band is less than the threshold, the method increases a formant enhancement gain for that band. A set of high pass filter gains (338) is combined (516) with the formant enhancement gains yielding combined gains that are then clipped (518), scaled (520) according to a total SNR, normalized (526), smoothed across time (530) and frequency (532), and used to reconstruct (532, 534) an audio signal.

22 Claims, 7 Drawing Sheets

U.S. PATENT DOCUMENTS

| | | | |
|---|---|---|---|
| 5,504,832 A * | 4/1996 | Taguchi | 704/201 |
| 5,611,002 A | 3/1997 | Vogten et al. | |
| 5,623,577 A | 4/1997 | Fielder | |
| 5,630,013 A | 5/1997 | Suzuki et al. | |
| 5,684,920 A * | 11/1997 | Iwakami et al. | 704/203 |
| 5,694,521 A | 12/1997 | Shlomot et al. | |
| 5,749,073 A | 5/1998 | Slaney | |
| 5,771,299 A | 6/1998 | Melanson | |
| 5,799,276 A * | 8/1998 | Komissarchik et al. | 704/251 |
| 5,806,023 A | 9/1998 | Satyamurti | |
| 5,812,966 A * | 9/1998 | Byun et al. | 704/207 |
| 5,828,995 A | 10/1998 | Satyamurti et al. | |
| 5,839,101 A * | 11/1998 | Vahatalo et al. | 704/226 |
| 5,842,172 A | 11/1998 | Wilson | |
| 5,920,840 A | 7/1999 | Satyamurti et al. | |
| 5,950,154 A * | 9/1999 | Medaugh et al. | 704/226 |
| 6,026,357 A * | 2/2000 | Ireton et al. | 704/207 |
| 6,173,255 B1 | 1/2001 | Wilson et al. | |
| 6,182,042 B1 | 1/2001 | Peevers | |
| 6,292,776 B1 | 9/2001 | Chengalvarayan | |
| 6,507,820 B1 | 1/2003 | Deutgen | |
| 6,539,355 B1 | 3/2003 | Omori et al. | |
| 6,639,987 B2 | 10/2003 | McIntosh | |
| 6,647,123 B2 | 11/2003 | Kandel et al. | |
| 6,813,600 B1 | 11/2004 | Casey, III et al. | |
| 6,879,955 B2 | 4/2005 | Rao | |
| 6,889,182 B2 | 5/2005 | Gustafsson | |
| 7,031,912 B2 * | 4/2006 | Yajima et al. | 704/208 |
| 7,058,572 B1 * | 6/2006 | Nemer | 704/226 |
| 7,177,803 B2 | 2/2007 | Boillot et al. | |
| 7,676,362 B2 | 3/2010 | Boillot et al. | |
| 2001/0021904 A1 | 9/2001 | Plumpe | |
| 2002/0010578 A1 * | 1/2002 | Padmanabhan | 704/231 |
| 2002/0065649 A1 | 5/2002 | Kim | |
| 2002/0087305 A1 * | 7/2002 | Erving et al. | 704/226 |
| 2002/0116177 A1 * | 8/2002 | Bu et al. | 704/200.1 |
| 2004/0002856 A1 | 1/2004 | Bhaskar et al. | |
| 2004/0052218 A1 | 3/2004 | Knappe | |
| 2005/0058278 A1 * | 3/2005 | Gallego Hugas et al. | 379/406.01 |
| 2005/0249272 A1 | 11/2005 | Kirkeby et al. | |
| 2006/0036439 A1 | 2/2006 | Haritaoglu et al. | |
| 2007/0092089 A1 | 4/2007 | Seefeldt et al. | |
| 2007/0233472 A1 | 10/2007 | Sinder et al. | |
| 2008/0004869 A1 | 1/2008 | Herre et al. | |

OTHER PUBLICATIONS

Meir Tzur (Zibulski) and Alexander A. Goldin, "Sound Equalization in a Noisy Environment", http://www.alango.com/contents/products/technologies/avq/papers/aes110_nde.pdf, 110th Audio Engineering Society Convention, May 12, 2001, 5 pages.

Alango Technologies, "Automatic Volume and eQualization Control", http://www.alango.com/contents/products/technologies/avq/papers/alango_avq.pdf, 2006, 1 page.

* cited by examiner

METHOD AND APPARATUS FOR INCREASING SPEECH INTELLIGIBILITY IN NOISY ENVIRONMENTS

CROSS REFERENCE TO RELATED APPLICATION

The present application is a continuation of, and claims priority and full benefit under 35 U.S.C. §120 to, U.S. patent application Ser. No. 11/137,182 entitled "Method and Apparatus of Increasing Speech Intelligibility in Noisy Environments" by Jianming J. Song et al. filed on May 25, 2005. The related application is assigned to the assignee of the present application and is hereby incorporated in entirety by this reference thereto.

FIELD

The present invention relates generally to improving the intelligibility of voice audio within noisy environments.

BACKGROUND

The last decade has witnessed the widespread adaptation of handheld wireless voice communication devices (e.g. Cellular Telephones). These devices have revolutionized personal communication by allowing telephone access from anywhere within reach of wireless network infrastructure (e.g., cellular networks, communication satellites, or other infrastructure of other wireless networks adapted for voice communications). Wireless voice communication technology has effected society at the root level of interpersonal relations, to with, people now expect to be reachable and to be able reach others from anywhere.

In as much as the use handheld wireless voice communication devices is not restricted to homes and offices, such devices will often be used in environments where there is considerable ambient noise. Examples of such environments include busy urban settings, inside moving vehicles, and on factory floors. Ambient noise in an environment can degrade the intelligibility of received voice audio and thereby interfere with users' ability to communicate.

It would be desirable to provide an improved method and apparatus to increase the intelligibility of speech emitted into noisy environments.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
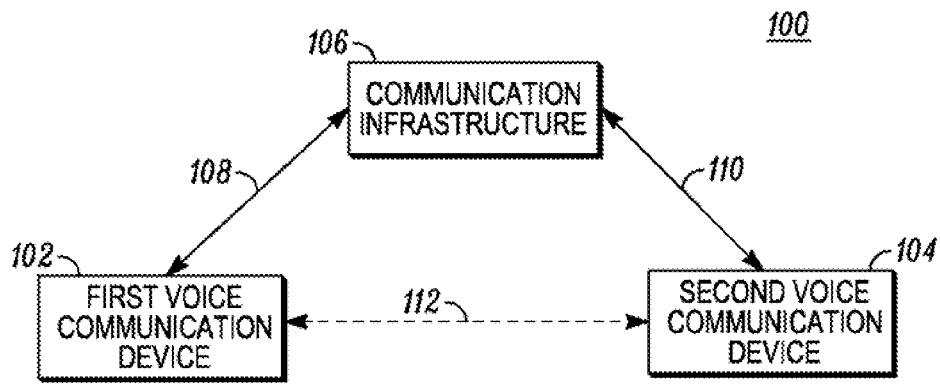
FIG. 1 is a block diagram of a voice communication system according to an embodiment of the invention.

Skilled artisans will appreciate that elements in the figures are illustrated for simplicity and clarity.

DETAILED DESCRIPTION

Before describing in detail embodiments that are in accordance with the present invention, it should be observed that the embodiments reside primarily in combinations of method steps and apparatus components related to speech intelligibility enhancement. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of voice intelligibility enhancement described herein. The non-processor circuits may include, but are not limited to, a radio receiver, a radio transmitter, signal drivers, clock circuits, power source circuits, and user input devices. As such, these functions may be interpreted as steps of a method to perform voice intelligibility enhancement. Alternatively, some or all functions could be implemented by a state machine that has no stored program instructions, or in one or more application specific integrated circuits (ASIC), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 is a block diagram of a voice communication system 100 according to an embodiment of the invention. The voice communication system 100 comprises a first voice communication device 102 and a second voice communication device 104. The first voice communication device 102 and the second voice communication device 104 may, for example, comprise a cellular telephone, a satellite telephone, a wireless handset for a wired telephone, a two-way radio, or a wired telephone. The first voice communication device 102 is coupled to a communication infrastructure 106 through a first communication channel 108 and similarly the second voice communication device 104 is coupled to the communication infrastructure 106 through a second communication channel 110. Communication signals that carry audio including speech are exchanged between the first voice communication device 102 and the second voice communication device 104 via the communication infrastructure 106. Alternatively, communication signals that carry audio including speech are coupled directly between the first voice communication device 102 and the second voice communication device 104 via a third communication channel 112. The communication channels 108, 110, 112 comprise, by way of example, radio links, optical links (e.g., fiber, free-space laser, infrared), and/or wire lines.

Figure 2:
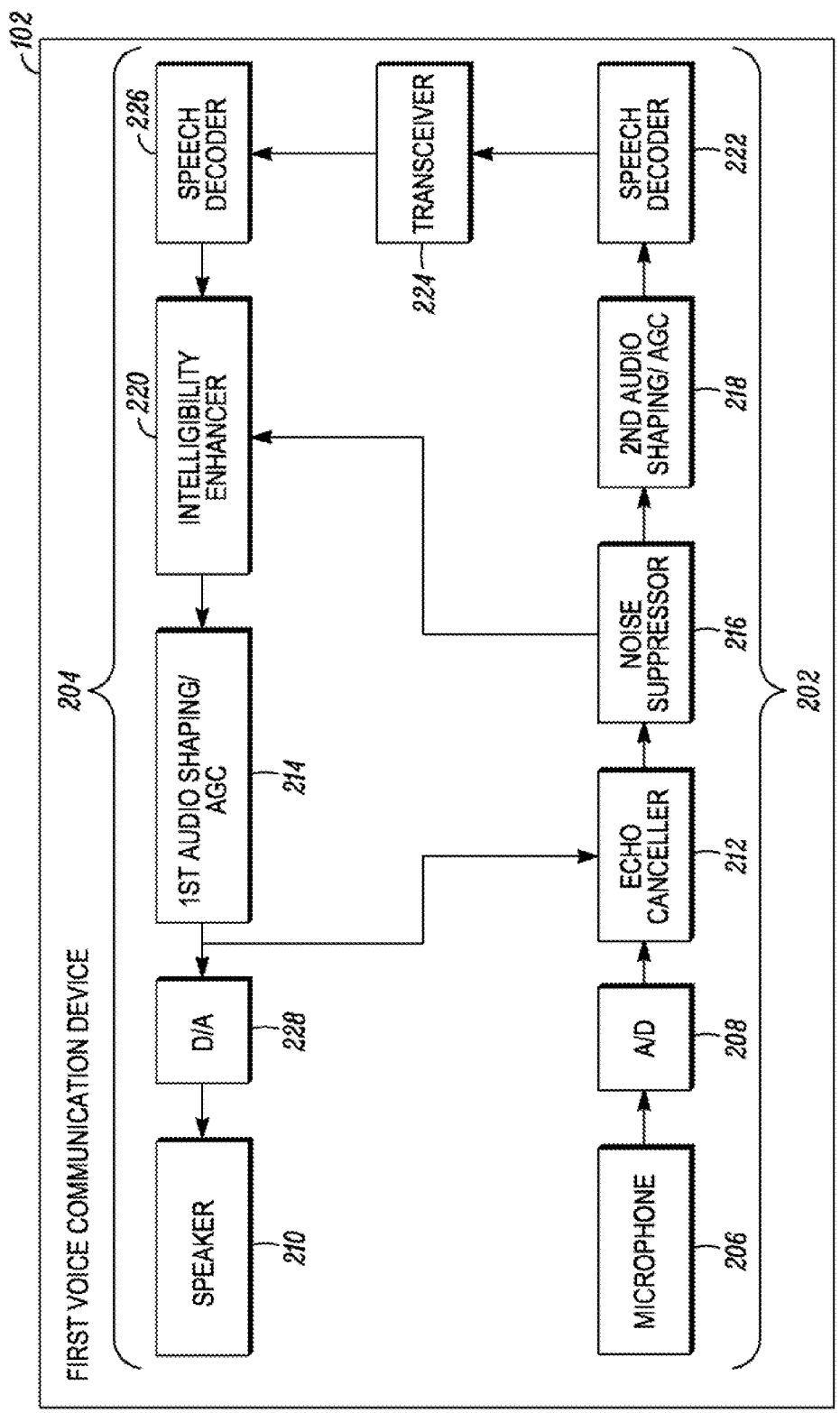
FIG. 2 is a functional block diagram of a voice communication device that is used in the system shown in FIG. 1 according to an embodiment of the invention.

FIG. 2 is a functional block diagram of the first voice communication device 102 that is used in the system 100 shown in FIG. 1 according to an embodiment of the invention. The second voice communication device 104 may or may not have a common design. Moreover, it should be understood, that although the architecture shown in FIG. 2 is suitable for including speech intelligibility enhancement according to teachings described hereinbelow, other architectures are also suitable.

As shown in FIG. 2 the first voice communication device 102 comprises an uplink path 202 and a downlink path 204. The uplink path 202 comprises a microphone 206 for generating electrical signal equivalents of audio in an environment of the first voice communication device 102. The audio includes speech that is spoken into the microphone 206 and noise from the environment in which the first voice communication device 102 is being operated. The microphone 206 is coupled to an analog-to-digital converter (A/D) 208. The A/D 208 produces digitized audio which is equivalent to the audio input through the microphone 206.

A speaker 210 is used to emit audio received through the downlink path 204. The audio emitted by the speaker 210 will feedback into the microphone 206. An echo canceller 212 receives the digitized audio output by the A/D 208 as well as digitized audio output by a first audio shaping/automatic gain control 214 in the downlink path 204. The echo canceller 212 serves to subtract an audio component that is due to audio emitted by a speaker 210 and picked up by the microphone 206 thereby reducing or eliminating feedback. The echo canceller 212 is coupled to a noise suppressor 216. The noise suppressor 216 determines a spectrum of noise in audio input through the microphone 206. The noise suppressor 216 is coupled to a second audio shaping/automatic gain control 218 and to an intelligibility enhancer 220. The noise suppressor 216 supplies audio with reduced noise content to the second audio shaping/automatic gain control 218 and supplies a noise signal or noise spectrum to the intelligibility enhancer 220. The functioning of the intelligibility enhancer 220 is described in more detail below with reference to FIGS. 3-7. The second audio shaping/automatic gain control 218 is coupled to a speech encoder 222 which is coupled to a transceiver 224.

The downlink path 204 further comprises a speech decoder 226 which is coupled to the transceiver 224 and to the intelligibility enhancer 220. The speech decoder 226 receives encoded speech from the transceiver 224 and supplies decoded speech to the intelligibility enhancer 220. The intelligibility enhancer 220 modifies the speech received from the speech decoder 226 (as described more fully below) and outputs intelligibility enhanced speech to the first audio shaping/automatic gain control 214. The first audio shaping/automatic gain control 214 is drivingly coupled to a digital-to-analog converter (D/A) 228 which is coupled to the speaker 210. Additional elements such as filters and amplifiers (not shown) are optionally included in the first voice communication device 102, e.g., between the D/A 228 and the speaker 210 and between the microphone 206 and the A/D 208.

Figure 3:
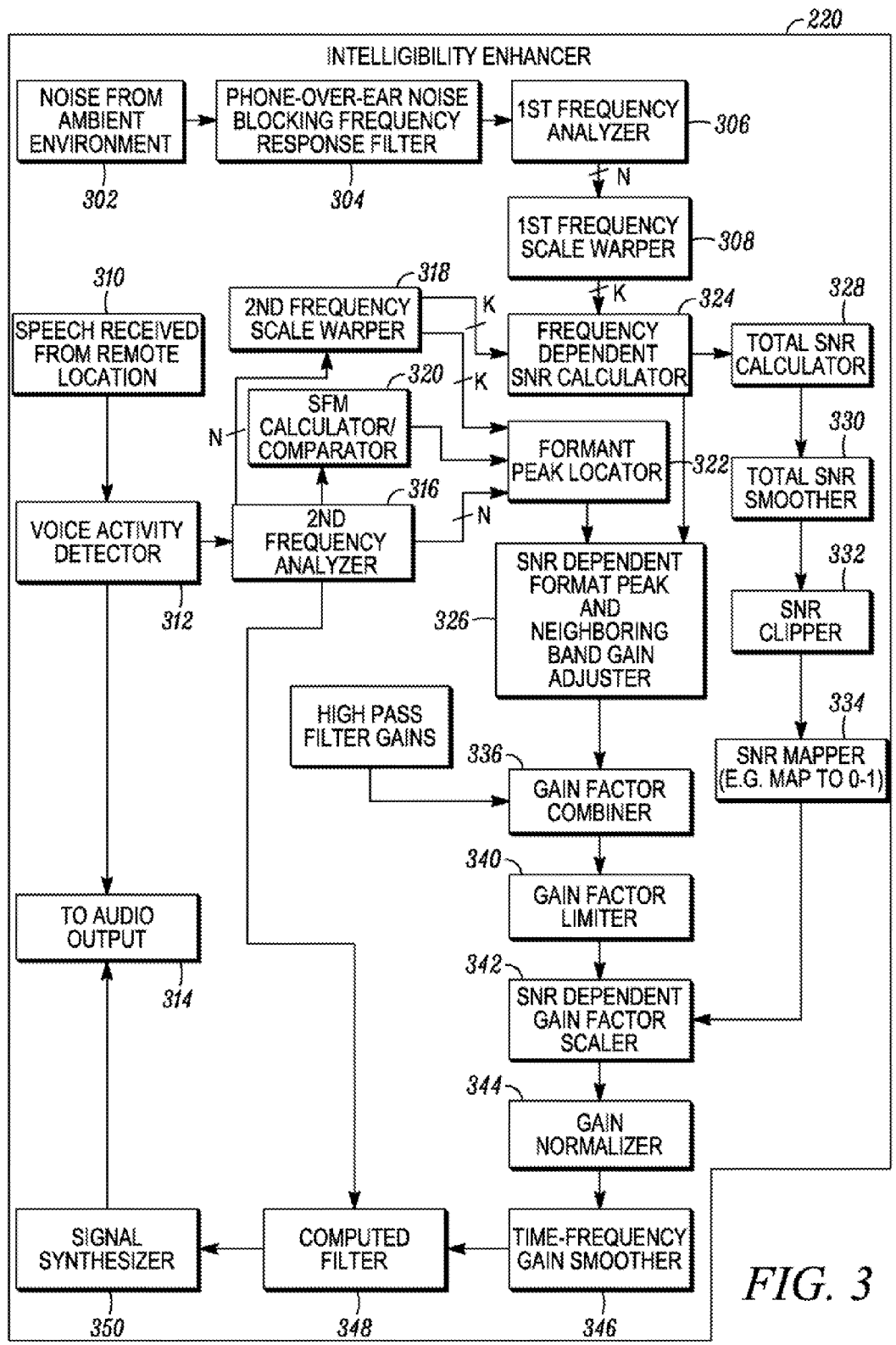
FIG. 3 is a block diagram of an intelligibility enhancer that is used in the voice communication device shown in FIG. 2 according to an embodiment of the invention.
Figure 4:
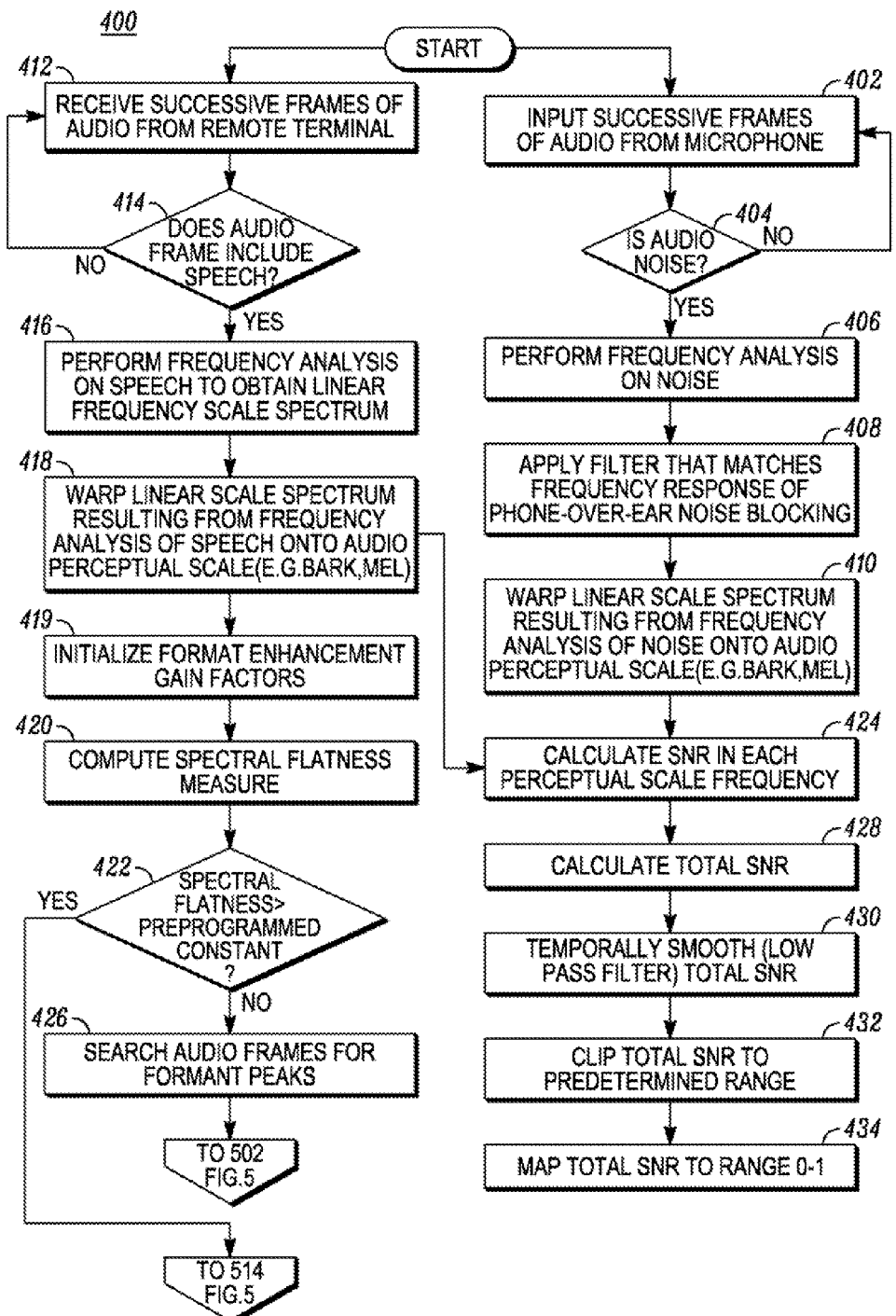
FIG. 4 is a first part of a flowchart of a method of increasing the intelligibility of audio according to an embodiment of the invention.
Figure 5:
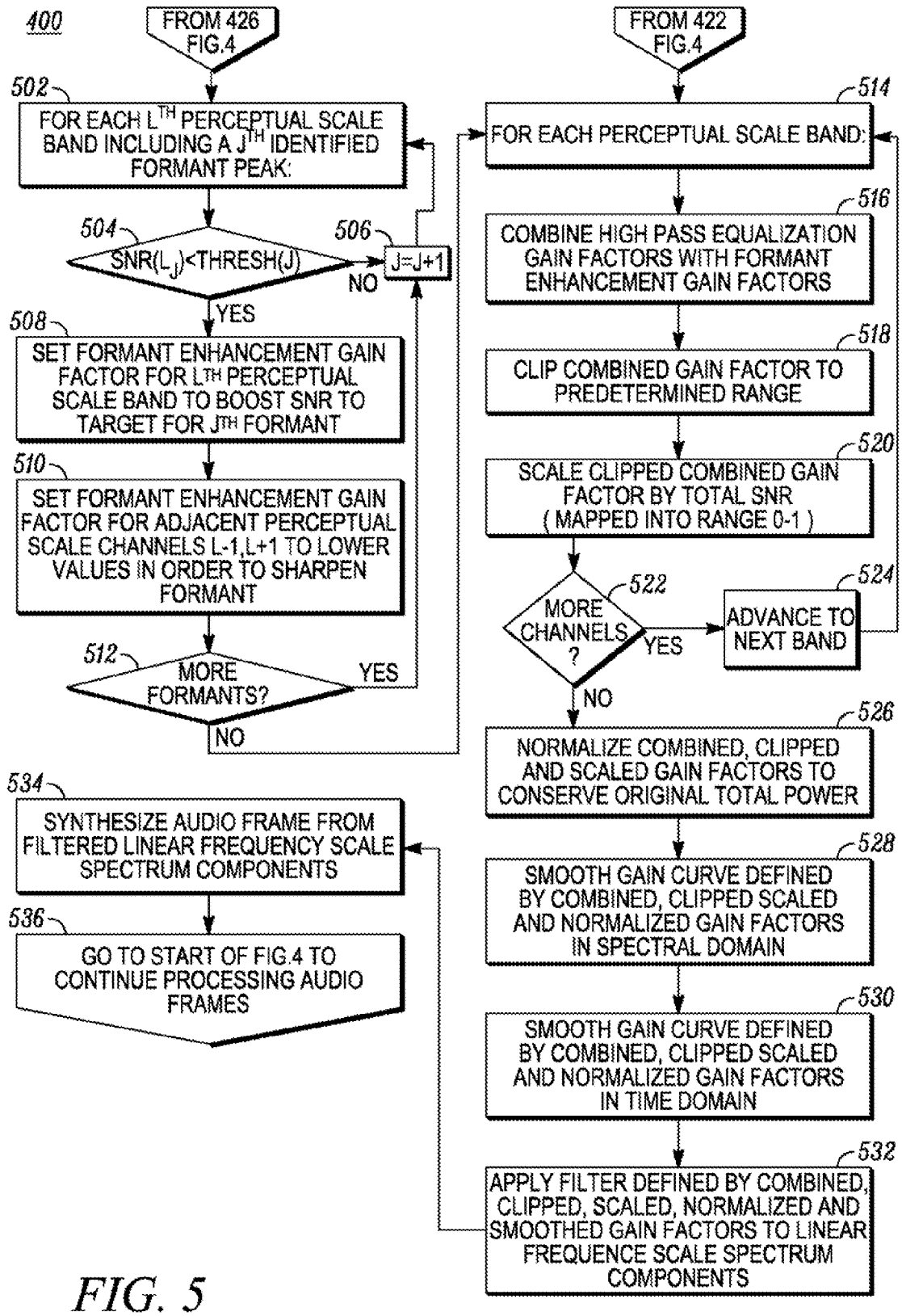
FIG. 5 is a second part of the flowchart started in FIG. 4.

FIG. 3 is a block diagram of the intelligibility enhancer 220 that is used in the first voice communication device 102 shown in FIG. 2 according to an embodiment of the invention. FIG. 3 includes numerous blocks which represent audio data transformation processes. FIGS. 4-5 show a flowchart of a process 400 for the operation of the intelligibility enhancer 220 according to an embodiment of the invention. The intelligibility enhancer 220 will be described with reference to FIGS. 3-5.

Note that the process 400 commences in FIG. 4 with two parallel tracks. The left hand track shows processing of audio received by the first voice communication device 104 via the transceiver 224 and the right hand track shows processing of audio in the environment of the first voice communication device 102. Once spectrum analysis of the noise in the environment has been completed in blocks 402-410 further processing is applied to intermediate data derived from both the received audio and the noise (e.g., signal-to-noise (SNR)) or just the received audio. A description of the spectral analysis of the noise will be given first.

In block 402 successive frames of audio are input. Block 404 is a decision block that tests if each frame is noise. If not the flowchart 400 loops back to block 402 to get a successive frame. If in block 404 a frame is determined to be noise, the process continues with block 406. Details of the methods used to distinguish between frames that include speech and noise frames are outside the focus of the present description.

In FIG. 3 an input for noise 302 is shown. In as much as the function of distinguishing noise frames from frames that include speech is typically implemented elsewhere in the communication device 102, e.g., in noise suppressor 216 it is not shown in FIG. 3. The noise that is input at block 302 can be in the form of a series of time domain samples, or a series of sets of spectral magnitudes each set being derived from one or more audio frames. In FIG. 4, frequency analysis is performed in block 406 on audio frames that are noise.

The representation of noise received at input 302 is derived from noise input through the microphone 206. Noise from the environment, which can degrade the intelligibility of voice audio received by the first voice communication device 102, will be coupled into a user's ear through the periphery of a space established between the user's ear and the first voice communication device 102 (or an earpiece accessory of the device 102). Noise can also be partially couple through the first voice communication device 102 itself. The first voice communication device 102 will physically block some ambient noise from reaching the user's ear. The blockage of noise is frequency dependent.

The input 302 in FIG. 3 is coupled to a phone-over-ear noise blocking frequency response filter 304. The filter 304 serves to model the frequency dependent physical blockage of ambient noise by the first voice communication device 102 (or accessory such as, for example, a hands-free operation earpiece).

In FIG. 3 the filter 304 is coupled to a first frequency analyzer 306, e.g. a fast Fourier transform (FFT). The first frequency analyzer 306 outputs spectral magnitudes for each a plurality (e.g., N=64) of frequency bands, for each successive audio frame. A common audio frame duration may be used in the uplink path 202 and the downlink path 204 of the first voice communication device 102. The common audio frame duration is typically 10 or 20 milliseconds.

In FIG. 4 the phone-over-ear noise blocking frequency response filter 304 is applied in block 408. Note that the order of block 406 and 408 in FIG. 4 is according to one alternative in which the phone-over-ear noise blocking frequency response filter 304 is applied in the frequency domain, whereas the order of blocks 304 and 306 in FIG. 3 is in accordance with another embodiment in which the filter 304 is a time domain filter.

The first frequency analyzer 306 supplies the spectral magnitudes (amplitude or energy) to a first frequency warper 308. In block 410, the first frequency warper 308 redistributes the spectral magnitudes on a perceptual frequency scale. The Bark scale is a suitable perceptual scale for use in the intelligibility enhancer 220.

Processing in the left hand track commencing FIG. 4 will now be described. In block 412 successive frames of audio are received (e.g., through the transceiver 224. Reference numeral 310 designates an input for audio including speech that is received from a remote terminal (through transceiver 224 and decoder 226) and is to be emitted by the speaker 210. The input 310 is coupled to a voice activity detector 312. (The same voice activity detector 312 can be used in other parts of the first voice communication device, e.g., in the noise suppressor 216). In the intelligibility enhancer 220, the voice activity detector 312 is used to either (1) route audio frames into processing stages of the intelligibility enhancer 220 in the case that the voice activity detector 312 determines that audio frames include voice audio or (2) bypass processing stages of the intelligibility enhancer 220 and route the audio frames directly to an audio output 314 of the intelligibility enhancer 220 if the voice activity detector 312 determines that the frames do not include a voice. Thus, the voice activity detector 312 serves to avoid operating the intelligibility enhancer 220 in an attempt to enhance the intelligibility of audio frames that do not include voice audio.

In FIG. 4 block 414 test whether each audio frame includes speech. If an audio frame does not include speech the process 400 loops back to block 412 to receive a next audio frame.

Frames that are determined to include voice activity are passed from the voice activity detector 312 to a second frequency analyzer 316. In block 416 the second frequency analyzer 316 performs frequency analysis on frames that include speech. The second frequency analyzer 316 suitably uses the same frequency analysis (e.g., 64 point FFT) as the first frequency analyzer 306. The second frequency analyzer 316 supplies spectral magnitudes derived from received speech to a second frequency scale warper 318 and to a formant peak locator 322. In block 418 the second frequency scale warper 318 redistributes the spectral magnitudes on the same perceptual frequency scale as the first frequency scale warper 308. In block 419 a set formant enhancement gain factors are initialized to zero.

The second frequency scale warper 318 is coupled to a spectral flatness measure (SFM) calculator/comparator 320, to the formant peak locator 322 and to a frequency dependent signal-to-noise ratio (SNR) calculator 324. The second frequency scale warper 318 supplies spectral magnitudes (on the perceptual frequency scale) to the formant peak locator 322, the SFM calculator 320 and the frequency dependent SNR calculator 322. The spectral magnitudes received from the second frequency scale warper 318 characterize audio frames including voice audio. After the spectral magnitudes on the perceptual frequency scale that characterize audio frames have been generated in block 418 of the process 400, the process 400 uses the spectral magnitudes in two separate branches, one commencing with block 419 and another commencing with block 424.

After block 419, in block 420 the SFM calculator/comparator 320 calculates the SFM of the current audio frame. One suitable SFM takes the form given by equation one.

$$SFM = \frac{\left(\prod_{i=1}^{K} x_i\right)^{1/K}}{\frac{1}{K}\sum_{i=1}^{K} x_i} \quad \text{EQU. 1}$$

where, $X_i$ is an $i^{th}$ spectral magnitude on a perceptual frequency scale having K bands.

In block 422 the spectral flatness calculator/comparator 320 compares the spectral flatness measure to a predetermined limit. Searching for formants in each audio frame is conditioned on the SFM being below a predetermined limit.

The limit to which the SFM is compared is to be chosen as a value which best differentiates between speech frames that include formants and frames that do not. The exact value of the predetermined limit will depend on, at least, the number of bands in the perceptual frequency scale and the duration of the audio frames.

Figure 6:
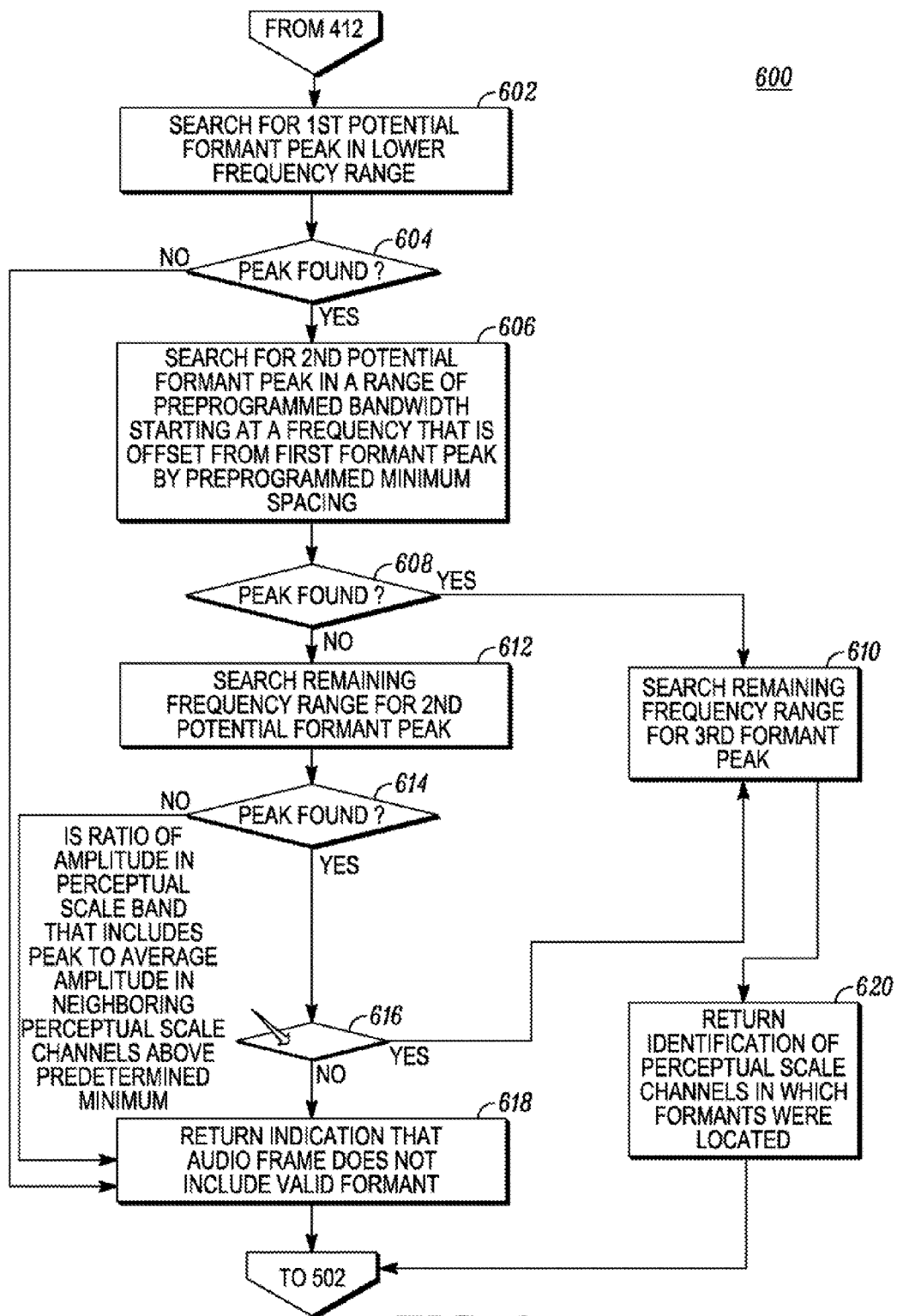
FIG. 6 is a flowchart of a sub-process used in the method shown in FIGS. 4-5 according to an embodiment of the invention.
Figure 7:
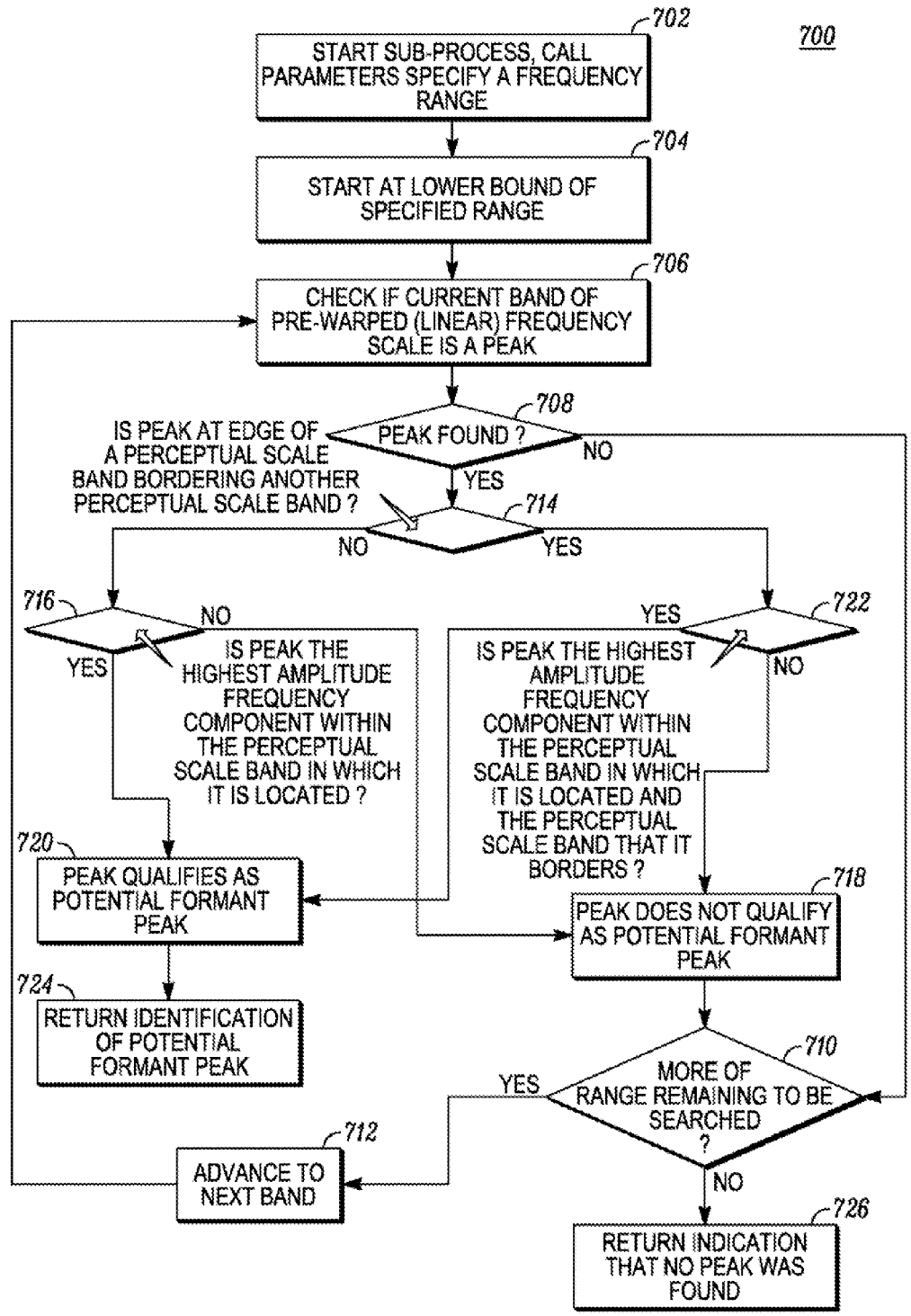
FIG. 7 is a flowchart of a sub-process used in the sub-process shown in FIG. 6 according to an embodiment of the invention.

If it is determined in block 422 that the SFM is above the predetermined limit, then the process 400 branches to block 514 described below. If it is determined in block 422 that the SFM is below the predetermined limit, then the process 400 continues with block 426 for locating valid formant peaks. Block 426 represents a sub-process, the details of which, according to certain embodiments, are shown in FIGS. 6-7.

In addition to the spectral magnitudes received from the second frequency scale warper 318, the frequency dependent SNR calculator 324 also receives spectral magnitudes (on the perceptual frequency scale) from the first frequency scale warper 308. The spectral magnitudes received from the first frequency scale warper 308 characterize ambient noise in the environment of the first voice communication device 102. Treating the spectral magnitudes received from the second frequency scale warper 318 as 'signal', in block 424 the frequency dependent SNR calculator 324 calculates the SNR for each band of the perceptual frequency scale. The SNR is suitably represented in decibels to facilitate further processing described hereinbelow. Expressed mathematically the SNR for an $i^{th}$ band during a $t^{th}$ audio frame is:

$$SNR_{i,t} = 10 \cdot \log_{10}(M\_Speech_{i,t}/M\_Noise_{i,t}) \quad \text{EQU. 2}$$

where, $M\_speech_{i,t}$ is a spectral magnitude of speech in the $i^{th}$ band during a $t^{th}$ audio frame; and $M\_noise_{i,t}$ is a spectral magnitude of noise in the $i^{th}$ band during the $t^{th}$ audio frame.

Using the spectral magnitudes received from the second frequency scale analyzer 316 and the spectral magnitudes (on the perceptual frequency scale) received from the second frequency scale warper 318, in block 426 the formant peak locator 322 identifies formants in the frames that include voice audio. Details of processes for locating formants are described with more detail below with reference to FIGS. 6-7.

The frequency dependent SNR calculator 324 is coupled to a SNR dependent formant peak and neighboring band gain adjuster 326 and to a total SNR calculator 328. In block 428, the total SNR calculator 328 sums the signal-to-noise ratios of all the bands of the perceptual scale. The total SNR for a $t^{th}$ audio frame is expressed by equation three.

$$SNR_t = \frac{1}{K} \sum_{i=1}^{K} SNR_{i,t} \qquad \text{EQU. 3}$$

The total SNR calculator 328 is coupled to a total SNR smoother 330. In block 430, the total SNR smoother 330 temporally smoothes the total SNR by taking a weighted sum of the total SNR calculated during different (e.g., successive) time frames. According to one embodiment, the operation of the total SNR smoother 330 is represented as:

$$SNR\_smoothed_t = \beta SNR\_smoothed_{t-1} + (\beta-1) SNR_t \qquad \text{EQU. 4}$$

where β is weight control parameter. Beta is suitably chosen 0.9 to 0.99.

The total SNR smoother 330 is coupled to a SNR clipper 332. In block 432, the SNR clipper 332 limits the range of the smoothed total SNR and outputs a clipped SNR. According to one embodiment, the operation of the total SNR clipper 332 is expressed in the following pseudo code:
   SNR_smoothed$_t$=MIN(SNR_smoothed$_t$, SNR_H)
   SNR_smoothed$_t$=MAX(SNR_smoothed$_t$, SNR_L)
where, SNR_H is an upper limit and SNR_L is a lower limit. SNR_H is suitably chosen in the range of 30 dB to 40 dB corresponding to a SNR at which the ambient noise is so weak that it will not degrade the intelligibility of speech in the audio output by the speaker 210. SNR_L is suitably chosen to be about 0 dB corresponding to a SNR level at which the ambient noise is high enough to substantially degrade the intelligibility of speech in the audio output by the speaker 210.

The SNR clipper 332 is coupled to a SNR mapper 334. In block 434, the SNR mapper 334 maps the clipped SNR into a predetermined range (e.g., 0 to 1) and outputs a SNR weight. According to one embodiment, the operation of the SNR mapper 334 is expressed mathematically by equation five as follows.

$$SNR\_WEIGHT_t = \frac{SNR\_H - SNR\_smoothed_t}{SNR\_H - SNR\_L} \qquad \text{EQU. 5}$$

Alternatively, a different set of mathematical functions/procedures are used to obtain a SNR weight that falls within a predetermined range (e.g., 0 to 1). As described further below the SNR weight is used to scale a gain curve.

Referring again to FIG. 3, using information as to formant locations on the perceptual frequency scale that is provided by the formant peak locator 322 and information as to the SNR in bands in which the format peaks are located that is provided by the frequency dependent SNR calculator 324, the SNR dependent formant peak and neighboring band gain adjuster 326, sets formant enhancement gain factors for bands that include formant peaks and neighboring bands, resulting in partially improved intelligibility. The operation of block 326, according to an embodiment of the invention is described in more detail with reference to blocks 502-512 of FIG. 5. Block 502 in FIG. 5 follows blocks 426. Block 502 is the top of a loop that processes each $L^{th}$ perceptual frequency scale band in which a peak of a $J^{th}$ formant is located.

As described more fully below with reference to FIG. 6 according to an embodiment of the invention a frame is required to have two formants in order for the formants to be treated as valid. A frame may also include three valid formants. Accordingly the index J shown in FIG. 5 which enumerates valid formant suitably ranges from 1 to 2 or from 1 to 3. The formants in each audio frame are enumerated in order from lowest frequency formant to highest frequency formant. In block 504 the SNR in a $L^{th}$ perceptual frequency scale band than includes a $J^{th}$ formant peak is compared to a $J^{th}$ threshold. If the SNR in the $L^{th}$ perceptual frequency scale band is not less the $J^{th}$ threshold, then the in block 506 the index j increment in order to process the next formant peak and the process 400 returns to the top of the loop commencing in block 502.

If it is determined in block 504 that the SNR in the $L^{th}$ perceptual frequency scale band that contains the $J^{th}$ formant peak is less the $J^{th}$ threshold then the process 400 branches to block 508 in which a formant enhancement gain factor for the $L^{th}$ band (previously initialized in block 419) is set to a positive value in order to boost the $L^{th}$ perceptual frequency scale band. Thereafter in block 510 formant enhancement gain factors for perceptual scale frequency bands adjacent to the $L^{th}$ band are decreased in order to sharpen $J^{th}$ formant. According to a particular embodiment the sub-processes performed in blocks 504, 508 and 510 are represented by the following pseudo code:
IF (SNR(L$_J$)<Threshold(j)) THEN
ΔG(L$_J$)=SNR_TARGET(J)−SNR(L$_J$)
ΔG(L$_J$)=MIN(ΔG(L$_J$), SNR_TARGET(J))
G$_{FE}$(L$_J$)=G$_{FE}$(L$_J$)+ΔG(L$_J$)
G$_{FE}$(L$_J$−1)=G$_{FE}$(L$_J$−1)−λΔG(L$_J$)
G$_{FE}$(L$_J$+1)=G$_{FE}$(L$_J$+1)−λΔG(L$_J$)
END IF In the pseudo code above ΔG(L$_J$) is a gain enhancement factor for $L^{th}$ band including the $j^{th}$ formant peak. In the pseudo code the gain enhancement factor ΔG(L$_J$) is expressed as additive term because pseudo code operates on gain represented in decibels. The first line of the above pseudo code performs the test of block 504. The second line sets the gain enhancement factor for the $L^{th}$ band that includes the peak of the $j^{th}$ formant to the difference between the actual SNR in the $L^{th}$ band and a SNR target for the $J^{th}$ formant. The third line of the pseudo code limits the gain enhancement factor and the fourth line adds the gain enhancement factor to a previous value of the gain enhancement factor. The fifth and sixth lines of the preceding pseudo code decrements the gain factors (expressed in decibels) for the $(L-1)^{th}$ and $(L+1)^{th}$ bands of the perceptual scale (which are adjacent to the $L^{th}$ band that includes the peak of the $J^{th}$ formant) by a fraction (specified by the λ parameter) of the gain enhancement factor ΔG(L$_J$).

After executing a process according to the pseudo code the formant enhancement gain factors will be stored in G$_{FE}$(L$_J$), G$_{FE}$(L$_J$−1) and G$_{FE}$(L$_J$+1). According to certain embodiments the SNR thresholds to which the SNR of the bands including the formant peaks are compared are in the range of 10 to 20 dB and the SNR targets used in the second and third lines of the preceding pseudo code are in the range of 6 dB to 12 dB. In embodiments in which the SNR thresholds that are used to determine if the formant enhancement gain factors will be adjusted are higher than the SNR targets, the process represented by the preceding pseudo code serves to limit distortion of the audio in the course of intelligibility enhancement. In certain embodiments the SNR targets increase as the index j (which specifies formants in order of frequency, from lowest to highest) increases. Using higher SNR targets in such embodiments further enhances intelligibility.

Referring again to FIG. 5, block 512 is a decision block the outcome of which depends on whether there are more formants among the formants located in block 426 that remain to be processed by the loop commenced in block 502. If so the process 400 increments the index j in block 506 and loops back to block 502 in order to process another formant.

If all the formants that were located in block 426 have been processed the process 400 branches to block 514 which commences a loop (blocks 514-524) that includes a sub-process that operates on gain factors for each band of the perceptual frequency scale. In block 516 a gain factor combiner 336 combines (by addition in the decibel scale representation) the formant enhancement gain factors with a set of gains 338 (including one for each band of the perceptual frequency scale) that define a high pass filter. In the case that the outcome of decision block 422 is positive meaning that, based on the SFM, the current audio frame was determined not to include formants, the process will branch directly from block 422 to block 514 and upon reaching block 514 the formant enhancement gain factors will not have been changed from the initial values (e.g., zero) set in block 419).

The gain factor combiner 336 is coupled to the SNR dependent formant peak and neighboring band gain adjuster 326 and the high pass filter gains 338. The high pass filter gains 338 are suitably embodied in the form of memory storing binary representations of the high pass filter gains 338. The gain factor combiner 336 receives the formant enhancement gains from the SNR dependent formant peak and neighboring band gain adjuster 326.

According to one embodiment the high pass filter gain 338 define a filter that has a flat frequency response at a first gain level (e.g. at −15 dB) from 0 to a first frequency (e.g., in the range of 300 Hz to 500 Hz) and a linearly increasing gain that increases from the first level at the first frequency up to a second level (e.g. 0 dB) at a second frequency (e.g., in the range of 2000 KHz to 2500 KHz). According to another embodiment of the invention the high pass filter is a first-order high pass filter of the form $1-\alpha z^{-1}$ where $\alpha$ is suitably in the range of 0.8 to 0.95. Block 516 yields a set of combined gain factors including one for each band of the perceptual frequency scale.

In block 518 a gain limiter 340 clips the combined gain factors so as to restrict the combined gain factors to a predetermined range and outputs clipped combined gain factors including one clipped combined gain factor for each band of the perceptual frequency scale. Limiting the combined gain factors to a predetermined range serves to limit distortion.

A SNR dependent gain factor scaler 342 is coupled to the SNR mapper 334 and receives the SNR weight (e.g. given by equation five) that is output by the SNR mapper 334. The SNR dependent gain factor scaler 342 is also coupled to the gain factor limiter 336 and receives the clipped combined gain factors (one for each band of the perceptual frequency scale) from the gain factor limiter 340. In block 520 the SNR dependent gain factor scaler 342 scales the clipped combined gain factors received from the gain factor limiter 340 by the SNR weight received from the SNR mapper 334. According to alternative embodiments only the formant enhancement gains or only the high frequency pass filter gains are scaled by a quantity derived from the total SNR (e.g., the SNR weight).

In FIG. 5, block 522 determines if more bands of the perceptual frequency scale remain. If so block 524 advances to a next band and the process 400 returns to block 514 in order to process the next band.

According to one embodiment of the invention the sub-processes performed in blocks 514-524 are conducted according to the following pseudo code.

for L from 0 to K:
G(L)=$G_{FE}$(L)+$G_{HP}$(L)
G(L)=MAX(G(L),min_GAIN)
G(L)=MIN(G(L),max_GAIN)
G(L)=G(L)*SNR_WEIGHT
Continue In the preceding pseudo code L is an index that identifies the bands of the perceptual frequency scale, K is the number of bands in the perceptual frequency scale, $G_{HP}$(L) is a high pass filter gain for the $L^{TH}$ band, $G_{FE}$(L) is a formant enhancement gain factor for the $L^{TH}$ band and G(L) is a combined gain factor for the $L^{TH}$ band.

A gain normalizer 344 is coupled to the SNR dependent gain factor scaler 342 and receives the scaled clipped combined gain factors therefrom. In block 526 of the process 400 the gain normalizer 344 normalizes the scaled, clipped, combined gain factors so as to preserve the total audio signal energy in each audio frame. The operation of the gain normalizer 344 is explained with reference to equations 6-10. The scaled clipped combined gain factors can be transformed from decibel to linear form by applying equation six.

$$G_{linear}(L)=10^{G(L)/20} \qquad \text{EQU. 6}$$

Prior to processing by the intelligibility enhancer 220 the energy in each audio frame summed over the perceptual frequency scale is given by equation seven.

$$E_{original} = \sum_{L=0}^{K} E(L) \qquad \text{EQU. 7}$$

where E(L) is the energy in an $L^{TH}$ band of the perceptual frequency scale.

If the audio in each audio frame were amplified by the scaled clipped combined gain factors without normalization, the energy of the audio frame would be given by equation eight.

$$E_{modified} = \sum_{L=0}^{K} G_{linear}^2(L)E(L) \qquad \text{EQU. 8}$$

In order for the energy given by equation eight to be equal to energy originally in the audio frame the right hand side of equation eight must be multiplied by an energy normalization factor (denoted $G_{NORM\_ENERGY}$) that is the square of an amplitude normalization factor denoted $G_{NORM\_AMP}$. The energy normalization factor is given by equation nine.

$$G_{NORM\_ENERGY} = \frac{\sum_{L=0}^{K} E(L)}{\sum_{L=0}^{K} G_{linear}^2(L)E(L)} \qquad \text{EQU. 9}$$

and the amplitude normalization factor is given by equation ten.

$$G_{NORM\_AMPLITUDE} = \sqrt{(G_{NORM\_ENERGY})} \qquad \text{EQU. 10}$$

A time-frequency gain smoother 346 is coupled to the gain normalizer 344 and receives normalized gain factors that are produced by the gain normalizer 344. In block 528 of process 400 the gain smoother 346 smoothes the normalized gain factors produced by the gain normalizer 344 in the spectral domain. Smoothing of the normalized gain factors in the spectral domain is described by equation eleven for bands that are not at extremes of the perceptual frequency scale.

$$G_{linear}(L,t)=\alpha G_{linear}(L-1,t)+(1-2\alpha)G_{linear}(L,t)+\alpha G_{linear}(L+1,t) \quad \text{EQU. 11}$$

In equation eleven $G_{linear}(L,t)$ is a linear gain factor for an $L^{th}$ band of the perceptual frequency scale, for a $t^{th}$ audio frame and $\alpha$ is parameter for controlling the relative weights applied to adjacent bands in performing smoothing. $\alpha$ is suitably set in the range of 0.1 to 0.2. For the first band of the perceptual frequency scale equation eleven is suitably modified by dropping the first term and inserting a factor of two before the third term. Likewise, for the last band of the perceptual frequency scale equation eleven is suitably modified by dropping the third term and inserting a factor of two in the first term.

In block 530 of process 400 the time-frequency gain smoother 346 smoothes the normalized gains factors in the temporal domain. Smoothing of the normalized gain factors is described by equation twelve.

$$G_{linear\_smoothed}(L,t)=vG_{linear}(L,t)+(1-v)G_{linear\_smoothed}(L,t-1) \quad \text{EQU. 12}$$

In equation twelve, v is parameter for controlling the relative weight assigned to normalized gain factors from successive audio frames. v is suitably set in the range of 0.3 to 0.7. In as much as the smoothing in the temporal and spectral domain are linear operations the order in which they are performed does not matter. Smoothing in the temporal domain serves to reduce audio artifacts that would otherwise arise do the fact that new and potentially different gain factors are being computed for each relatively short (e.g., 10 millisecond) audio frame.

The time-frequency gain smoother 346 outputs a computed filter 348 that is defined by the combined, clipped, scaled, normalized and smoothed gain factors. In block 532 the computed filter is applied to the spectral magnitudes output by the second frequency analyzer 316 that represent a frame of speech received by the transceiver 224. After applying the computed filter a set of resulting filtered spectral magnitudes are passed to a signal synthesizer 350. In block 534 of the process 400 the signal synthesizer synthesizes (e.g. by 64 point inverse FFT) a frame of speech which has improved intelligibility notwithstanding the presence of ambient noise in the environment of the first voice communication device 102. The signal synthesizer 350 is coupled to the audio output 314 of the intelligibility enhancer 220. Block 536 represents a return to the beginning of the process 400 in order to process a next audio frame. The process 400 suitably runs continuously when audio is being received by the first voice communication device 102.

FIG. 6 is a flowchart of a sub-process 600 used to carry out block 426 of the process 400 shown in FIGS. 4-5 according to an embodiment of the invention. In block 602 a lower frequency range (within a broader frequency spanned by the perceptual frequency scale) is searched for a first formant peak. Details of how block 602 and blocks 606, 610 and 612 are performed are discussed below are described in more detail below with reference to FIG. 7.

Block 604 is a decision block the outcome of which depends on whether a formant peak was found in the lower frequency range. The test performed in block 604 requires that formants must be found in the lower frequency range as a condition for determining that an audio frame includes valid formants. If the outcome of block 604 is negative then the sub-process 600 branches to block 618 in which an indication that the audio frame does not include a valid formant is returned to the process 400 shown in FIG. 4.

If the outcome of block 604 is positive the sub-process 600 branches to block 606 in which a second frequency range is searched for a second formant peak. The second frequency range has a preprogrammed width and is offset from the first formant peak by a preprogrammed minimum formant peak spacing. Block 608 is a decision block, the outcome of which depends on whether the search performed in block 606 was successful. If so, then the sub-process 600 branches to block 610 in which a remaining frequency range, above the second frequency range, is searched for a third formant peak.

If the outcome of decision block 608 is negative, the sub-process 600 branches to block 612 in which the remaining frequency range, above the second frequency range, is searched for a second formant peak. Decision block 614 depends on whether the search performed in block 612 was successful. If not, meaning that a second formant peak could not be located, then the sub-process branches to block 618 to return an indication that the audio frame being processed does not include valid formants. If a second formant was located in the remaining frequency range (above the second frequency range) an additional requirement is imposed in block 616. Block 616 tests if a ratio of an amplitude (or energy) in a perceptual frequency scale band that includes the second formant peak to amplitudes (or energies) in adjacent bands (e.g., two neighboring bands) is above a preprogrammed threshold. Qualitatively speaking, block 616 requires that formant peaks located above the second frequency range be pronounced peaks. If the outcome of decision block 618 is negative then the sub-process 600 branches to block 618 in which an indication that the audio frame does not include a valid formant is returned to the process 400. If the outcome of block 618 is positive then the sub-process branches to block 610 in order to search the remaining frequency range, beyond the second formant peak for a third formant peak. After executing block 610 the process branches to block 620 in which an identification of perceptual frequency scale bands in which formant peaks are located is returned to the process 400 shown in FIGS. 4-5.

As shown the sub-process 600 requires that at least two formant peaks be found in an audio frame, for the formant peaks to be considered valid. This requirement is based on the knowledge of the nature of formants produced by the human vocal apparatus and helps to distinguish valid formants from background noise. (Certain common types of background noise have one dominant peak that sub-process 600 will reject).

FIG. 7 is a flowchart of a sub-process 700 for searching for formant peaks that is used in blocks 602, 606, 610 and 612 of the sub-process shown in FIG. 6 according to an embodiment of the invention. Block 702 represents the start of the sub-process 700 and indicates that the sub-process 700 accepts parameters that specify the bounds of a frequency range to be searched. In searching for formant peaks the sub-process 700 uses pre-programmed information as to the bounds of the bands in the perceptual frequency scale and also uses the pre-warped spectral magnitudes produced by the second frequency analyzer 316. Typically, there will be more than one pre-warped (linear) frequency scale bands for each perceptual scale frequency band.

Block 704 commences searching at a lower bound of the frequency range to be searched. Alternatively, searching can be commenced at an upper bound. Block 706 checks each of the pre-warped (linear) frequency components looking for a local maximum, i.e., a spectral magnitude that is higher than magnitudes in immediately adjacent bands of the pre-warped spectrum. Block 708 is a decision block the outcome of which depends whether on a peak is found in a current band being examined by the sub-process 700. If not, the sub-process 700 branches to decision block 710 which tests if more of the range to be searched remains to be searched. If so, then in block 712 the sub-process 700 advances to a next band of the pre-warped (linear) frequency scale and then returns to block 708 to check the next band.

If it is determined in block 708 that a peak has been found, then the sub-process 700 continues with decision block 714, the outcome of which depends on whether the peak is found in a band of the pre-warped spectrum that is at the edge of a perceptual frequency scale band bordering another band of the perceptual frequency scale. If not, then the sub-process 700 branches to decision block 716 which tests if the peak is the highest magnitude pre-warped (linear) frequency component within the perceptual frequency scale band in which the peak is located. If the outcome of block 716 is negative, then the sub-process branches to block 718 meaning that the peak does not qualify as a potential formant peak. After block 718 the sub-process continues with block 710 described above. If the outcome of block 716 is positive the sub-process 700 branches to block 720 meaning that the peak does qualify as a potential formant peak. After block 720 the sub-process goes to block 724 in which an identification of the potential formant peak is returned to sub-process 600.

If the outcome of block 714 is positive then the sub-process 700 branches to decision block 722 which tests if the peak found in blocks 706-708 is the highest amplitude frequency component within the perceptual frequency scale band in which it is located and within the perceptual frequency scale band that the peak borders. If the outcome of block 722 is positive, the sub-process 700 branches to block 720 which is described above. If the outcome of block 722 is negative the sub-process 700 branches to block 718 which is described above. In the case that a peak that qualifies as a potential formant peak is found, block 720 is followed by block 724 in which an identification of the potential formant peak is returned to sub-process 600. In the case that the frequency range searched by sub-process 700 does not include a peak that qualifies as a potential formant peak, after searching through the entire frequency range, the sub-process 700 will branch from block 710 to block 726 in which an indication that no potential formant peak was found will be returned to sub-process 600.

Figure 8:
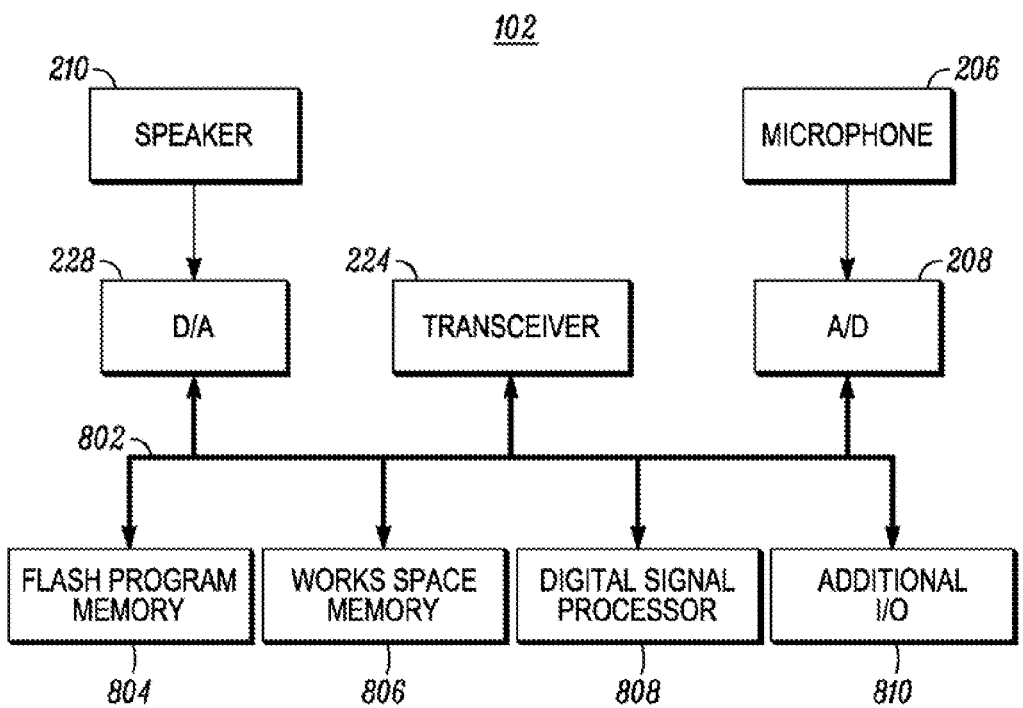
FIG. 8 is a hardware block diagram of the voice communication device shown in FIG. 2 according to an embodiment of the invention.

FIG. 8 is a hardware block diagram of the first voice communication device 102 according to an embodiment of the invention. As shown in FIG. 8, the A/D 208, the D/A 228 and the transceiver 224 are coupled to a digital signal bus 802. A flash program memory 804, a work space memory 806, a digital signal processor (DSP) 808 and an additional Input/Output interface (I/O) 810 are also coupled to the digital signal bus 802. The flash program memory 804 is used to store one or more programs that implement the intelligibility enhancer 220 as described above with reference to FIGS. 3-7. The one or more programs are executed by the DSP 808. Alternatively, another type of memory is used in lieu of the flash program memory 804. The additional I/O 810 is suitably used to interface to other user interface components such as, for example, a display screen, a touch screen, and/or a keypad.

Although FIG. 8 shows a programmable DSP hardware, alternatively the intelligibility enhancer 220 is implemented in an Application Specific Integrated Circuit (ASIC).

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of improving intelligibility of speech that is included in audio that is emitted into a noisy environment, the method comprising:
   determining if one or more voice formants are present in each $i^{th}$ audio segment of a plurality of audio segments;
   if one or more formants are determined to be present in the $i^{th}$ audio segment:
      selecting a perceptual frequency scale band (L) including at least one of the one or more formants from a plurality of perceptual frequency scale bands of a perceptual scale ambient noise spectrum of the noisy environment;
      comparing, to a threshold, a signal-to-noise ratio of the perceptual frequency scale band, and
         if the signal-to-noise ratio is less than the threshold, increasing a formant enhancement gain for the perceptual frequency scale band;
   computing a summed signal-to-noise ratio across at least a portion of the perceptual scale ambient noise spectrum wherein a plurality of speech magnitudes in each of the plurality of perceptual frequency scale bands are used as signal magnitudes;
   scaling a set of overall gains that include at least the formant enhancement gains as a function of the summed signal-to-noise ratio;
   smoothing the set of overall gains;
   filtering the $i^{th}$ audio segment with the set of overall gains; and
   outputting the $i^{th}$ audio segment into the noisy environment.

2. The method according to claim 1 further comprising:
   reading a plurality of high pass filter gains that include a high pass filter gain for each of the plurality of perceptual frequency scale bands;
   for each perceptual frequency scale band that includes at least one of the one or more formants, combining the formant enhancement gain with the high pass filter gain for the perceptual frequency scale band to produce a combined gain for the perceptual frequency scale band to obtain the set of overall gains for the plurality of perceptual frequency scale bands.

3. The method according to claim 1 further comprising:
   creating the perceptual scale ambient noise spectrum of the noisy environment by analyzing ambient noise in the noisy environment to produce a noise spectrum on the Bark scale.

4. The method according to claim 1 wherein determining if one or more voice formants are present in each $i^{th}$ audio segment of a plurality of audio segments comprises:
   computing a spectral flatness measure for the $i^{th}$ audio segment; and
   comparing the spectral flatness measure to a bound.

5. The method according to claim 1 wherein determining if one or more formants are present in each $i^{th}$ audio segment of a plurality of audio segments comprises:
   determining if two voice formants are present in each $i^{th}$ audio segment.

6. The method according to claim 5 wherein determining if two voice formants are present in each $i^{th}$ audio segment comprises:
   searching a first frequency range for a first voice formant;
   if the first voice formant is found at a first frequency in the first frequency range:
      searching for a second voice formant in a second frequency range that is spaced from the first frequency by a predetermined frequency offset, and if the second voice formant is not located in the second frequency range, searching for the second voice formant in a third frequency range, and if the second voice formant is found in the third frequency range, testing if a ratio of magnitude of the second voice formant relative to a magnitude in a defined neighborhood of the second voice formant is less than a predetermined value, and if the ratio is less than the predetermined value, rejecting the second voice formant.

7. The method according to claim 1 wherein the threshold is related to the voice formant.

8. The method according to claim 1 wherein if one or more voice formants are determined to be present in the $i^{th}$ audio segment and if the signal-to-noise ratio is less than the threshold, the method further comprises:
   decreasing a formant enhancement gain for a pair of perceptual frequency scale bands on opposite sides of the perceptual frequency scale band (L).

9. The method according to claim 1 wherein computing a summed signal-to-noise ratio across at least a portion of the perceptual scale ambient noise spectrum comprises:
   computing the summed signal-to-noise ratio across the perceptual scale ambient noise spectrum.

10. The method according to claim 1 further comprising:
    clipping the summed signal-to-noise ratio to a predetermined range.

11. The method according to claim 1 further comprising:
    normalizing the set of overall gains to maintain an energy of the $i^{th}$ audio segment.

12. The method according to claim 1 wherein smoothing the set of overall gains comprises:
    smoothing the set of overall gains across the perceptual scale ambient noise spectrum.

13. The method according to claim 1 wherein smoothing the set of overall gains comprises:
    temporally smoothing the set of formant enhancement gains.

14. The method according to claim 13 wherein smoothing the set of overall gains comprises:
    smoothing the set of formant enhancement gains across the perceptual scale ambient noise spectrum.

15. The method according to claim 1 further comprising:
    filtering a noise spectrum with a filter that matches an average frequency response of a physical obstruction proximate a user's ear.

16. An audio apparatus adapted for outputting speech in a noisy environment, the audio apparatus comprising:
    a speaker for outputting the speech;
    a microphone for receiving ambient noise from the noisy environment;
    a source of audio to be output into the noisy environment;
    a processor coupled to the source of audio, the speaker, and the microphone, wherein the processor is programmed to:
       determine if one or more voice formants are present in each $i^{th}$ audio segment of a plurality of audio segments;
       if one or more formants are determined to be present in the $i^{th}$ audio segment:
          select a perceptual frequency scale band (L) including at least one of the one or more formants from a plurality of perceptual frequency scale bands of a perceptual scale ambient noise spectrum of the noisy environment;
          compare, to a threshold, a signal-to-noise ratio of the perceptual frequency scale band, and
             if the signal-to-noise ratio is less than the threshold, increase a formant enhancement gain for the perceptual frequency scale band;
       compute a summed signal-to-noise ratio across at least a portion of the perceptual scale ambient noise spectrum wherein a plurality of speech magnitudes are used as signal magnitudes;
       scale a set of overall gains that include at least the formant enhancement gains as a function of the summed signal-to-noise ratio;
       smooth the set of overall gains;
       filter the $i^{th}$ audio segment with the set of overall gains; and
       output the $i^{th}$ audio segment into the noisy environment.

17. The audio apparatus according to claim 16 wherein the processor is further programmed to:
    read a plurality of high pass filter gains that include a high pass filter gain for each of the plurality of perceptual frequency scale bands;
    for each perceptual frequency scale band that includes at least one of the one or more formants, combine the formant enhancement gain with the high pass filter gain for the perceptual frequency scale band to produce a combined gain for the perceptual frequency scale band to obtain the set of overall gains for the plurality of perceptual frequency scale bands.

18. The audio apparatus according to claim 16 wherein the processor is programmed to:
    analyze the ambient noise in the noisy environment to produce a noise spectrum on the Bark scale to create the perceptual scale ambient noise spectrum of the noisy environment.

19. The audio apparatus according to claim 16 wherein the processor is programmed to:
    determine if two voice formants are present in each $i^{th}$ audio segment.

20. The audio apparatus according to claim 19 wherein in determining if two formants are present in each $i^{th}$ audio segment, the processor is programmed to:
    search a first frequency range for a first voice formant;
    if the first voice formant is found at a first frequency in the first frequency range:
       search for a second voice formant in a second frequency range that is spaced from the first frequency by a predetermined frequency offset, and if the second voice formant is not located in the second frequency range, searching for the second voice formant in a third frequency range, and if the second voice formant is found in the third frequency range, testing if a ratio of magnitude of the second voice formant relative to a magnitude in a defined neighborhood of the second voice formant is less than a predetermined value, and if the ratio is less than the predetermined value, rejecting the second voice formant.

21. The audio apparatus according to claim 16 wherein the threshold is related to the voice formant.

22. The audio apparatus according to claim 16 wherein if one or more voice formants are determined to be present in the $i^{th}$ audio segment and if the signal-to-noise ratio is less than the threshold, the processor is further programmed to:
  decrease a formant enhancement gain for a pair of perceptual frequency scale bands on opposite sides of the perceptual frequency scale band (L).

* * * * *